US008044416B2

(12) United States Patent
Wang et al.

(10) Patent No.: US 8,044,416 B2
(45) Date of Patent: Oct. 25, 2011

(54) METHOD FOR FABRICATING HIGH-POWER LIGHT-EMITTING DIODE ARRAYS

(75) Inventors: Li Wang, Nanchang (CN); Fengyi Jiang, Jiang Xi (CN); Yingwen Tang, Jiang Xi (CN); Junlin Liu, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 578 days.

(21) Appl. No.: 12/093,549

(22) PCT Filed: Mar. 25, 2008

(86) PCT No.: PCT/CN2008/000583
§ 371 (c)(1),
(2), (4) Date: May 13, 2008

(87) PCT Pub. No.: WO2009/117847
PCT Pub. Date: Oct. 1, 2009

(65) Prior Publication Data
US 2010/0176404 A1 Jul. 15, 2010

(30) Foreign Application Priority Data

Mar. 25, 2008 (CN) .................. PCT/CN2008/000583

(51) Int. Cl.
*H01L 33/30* (2010.01)
(52) U.S. Cl. ................ 257/88; 257/81; 257/94; 257/99; 257/E33.026

(58) Field of Classification Search .................... 257/81, 257/88, 94, 99, E33.026
See application file for complete search history.

(56) References Cited

U.S. PATENT DOCUMENTS

| 4,864,216 A * | 9/1989 | Kalata et al. .................. 323/315 |
| 2002/0123164 A1 | 9/2002 | Slater, Jr. |
| 2009/0134420 A1 * | 5/2009 | Nagai .............................. 257/98 |

* cited by examiner

*Primary Examiner* — Long Pham
(74) *Attorney, Agent, or Firm* — Shun Yao; Park, Vaughan, Fleming & Dowler LLP

(57) ABSTRACT

One embodiment of the present invention provides a method for fabricating a high-power light-emitting diode (LED). The method includes etching grooves on a growth substrate, thereby forming mesas on the growth substrate. The method further includes fabricating indium gallium aluminum nitride (InGaAlN)-based LED multilayer structures on the mesas on the growth substrate, wherein a respective mesa supports a separate LED structure. In addition, the method includes bonding the multilayer structures to a conductive substrate. The method also includes removing the growth substrate. Furthermore, the method includes depositing a passivation layer and an electrode layer above the InGaAlN multilayer structures, wherein the passivation layer covers the sidewalls and bottom of the grooves. Moreover, the method includes creating conductive paths which couple a predetermined number of adjacent individual LEDs, thereby allowing the LEDs to share a common power supply and be powered simultaneously to form a high-power LED array.

7 Claims, 4 Drawing Sheets

METHOD FOR FABRICATING HIGH-POWER LIGHT-EMITTING DIODE ARRAYS

This application is the U.S. National Stage application under 35 U.S.C. section 371 of PCT Application No. PCT/CN2008/000583, entitled "METHOD FOR FABRICATING HIGH-POWER LIGHT-EMITTING DIODE ARRAYS," by inventors Li Wang, Fengyi Jiang, Yingwen Tang, and Junlin Liu, filed 25 Mar. 2008.

BACKGROUND

1. Field of the Invention

The present invention relates to the fabrication of high-power light-emitting devices. More specifically, the present invention relates to a technique for fabricating high-power light-emitting diode arrays based on group III-V nitride semiconductor material by using a wafer bonding method. The method disclosed herein improves the yield rate of high-power light-emitting devices.

2. Related Art

Light-emitting diodes (LEDs), which emit light when electric current is driven through the device, have garnered increasing utility in recent decades as technology has advanced. Early usages of LEDs were largely limited to items such as indicator lights and numeric displays. Today, thanks to technological breakthroughs in semiconductor material development and fabrication process, LEDs are used in a wide variety of consumer and commercial products such as traffic lights, flashlights, large-scale video displays, vehicle lights, exit signs, and so forth.

LEDs can emit light at high levels of intensity in a more energy and cost efficient manner than conventional light bulbs can. LEDs produce more light per watt, have significantly lengthy life spans, and can emit colored light without the need for use of color filters, all of which lower costs and increase efficiency. Their small size and low heat dissipation also expand the range of products in which LEDs can be utilized.

Given the same current density and luminance efficiency, the power of an LED is proportional to the size of its light-emitting area. The larger the light-emitting area, the higher the power of an LED. The size of a typical LED is 300×300 $\mu m^2$. In order for a single LED to generate high power, its size typically needs to be greater than 1×1 $mm^2$.

Numerous techniques are used in fabricating LEDs. Among others, wafer bonding is a valuable technique for manufacturing high-quality LEDs using InGaAlN semiconductor material. The yield rate of LEDs with a size of 300×300 $\mu m^2$ fabricated using wafer bonding is typically better than 99.9%. However, when wafer bonding is used to manufacture high-power LEDs with a size greater than 1×1 $mm^2$, the yield rate often drops down to 80%.

SUMMARY

One embodiment of the present invention provides a method for fabricating a high-power light-emitting diode (LED). The method includes etching grooves on a growth substrate, thereby forming mesas on the growth substrate. The method further includes fabricating indium gallium aluminum nitride (InGaAlN)-based LED multilayer structures on the mesas on the growth substrate, wherein a respective mesa supports a separate LED structure. In addition, the method includes bonding the multilayer structures to a conductive substrate. The method also includes removing the growth substrate. Furthermore, the method includes depositing a passivation layer and an electrode layer above the InGaAlN multilayer structures, wherein the passivation layer covers the sidewalls and bottom of the grooves. Moreover, the method includes creating conductive paths, which couple a predetermined number of adjacent individual LEDs, thereby allowing the LEDs to share a common power supply and be powered simultaneously to form a high-power LED array.

In a variation of this embodiment, the width of the grooves is greater than 15 $\mu m$ and less than 25 $\mu m$.

In a variation of this embodiment, the width of the grooves is approximately 20 $\mu m$.

In a variation of this embodiment, the width of the grooves is approximately the same for all grooves.

In a variation of this embodiment, the widths of the grooves are different. The wide grooves demarcate the LED arrays while the narrow grooves demarcate individual LEDs within an array.

In a variation of this embodiment, the electrode comprises gold-germanium-nickel alloy.

In a variation of this embodiment, the passivation layer comprises silicon dioxide.

In a variation of this embodiment, creating the conductive paths, which couple adjacent LEDs, involves depositing a metal layer in a predetermined pattern between the electrodes of the adjacent LEDs to form the conductive paths.

In a variation of this embodiment, creating the conductive paths, which couple adjacent LEDs, involves bonding conductive wires to the electrodes of the adjacent LEDs and coupling the conductive wires together.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the appended claims.

Embodiments of the present invention provides a method for fabricating high-power LED arrays by using a wafer bonding method without lowering the yield of the devices. Generally, increasing the size of the light-emitting area of an LED can increase its luminance power. However, rather than fabricating a single LED with a large light-emitting area, the present invention provides a method for fabricating a high-power LED array based on regular-sized LEDs coupled in parallel. The yield rate of such LED arrays is similar to that of regular-sized devices.

Figure 1:
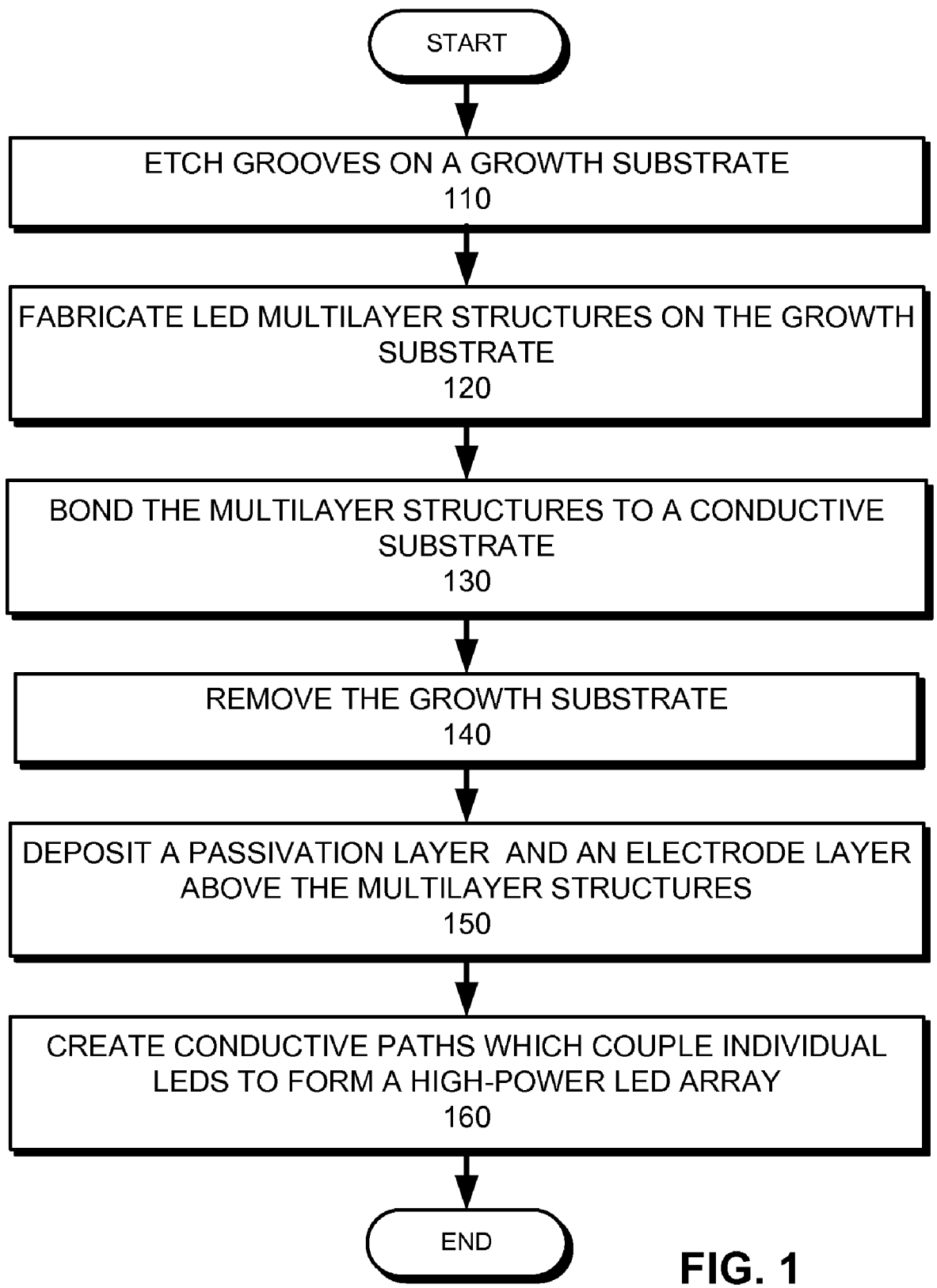
FIG. 1 presents a flow chart illustrating the process of fabricating high-power LED arrays in accordance with one embodiment of the present invention.

FIG. 1 presents a flow chart illustrating the process of fabricating high-power LED arrays in accordance with one embodiment. The fabrication process involves first etching crisscross grooves on a growth substrate, thereby forming mesas on the growth substrate (operation 110). Then, an indium gallium aluminum nitride (InGaAlN) multilayer structure is fabricated on each of the mesas on the growth silicon substrate (operation 120). Next, a metal bonding layer is deposited on the multilayer structure. A separate conductive substrate coated with a metal bonding layer is prepared and then pressure-welded to the multilayer structure. After wafer bonding, the LED structures previously fabricated on individual mesas on the growth substrate are now positioned in an arrayed fashion on the conductive substrate (operation 130). Subsequently, the growth substrate is removed by wet etching (operation 140). Afterwards, a passivation layer and an electrode layer are deposited on top of the LEDs (operation 150). Conductive paths are then created to couple a predetermined number of regular-sized LEDs together to form a high-power LED array (operation 160).

Figure 2A:
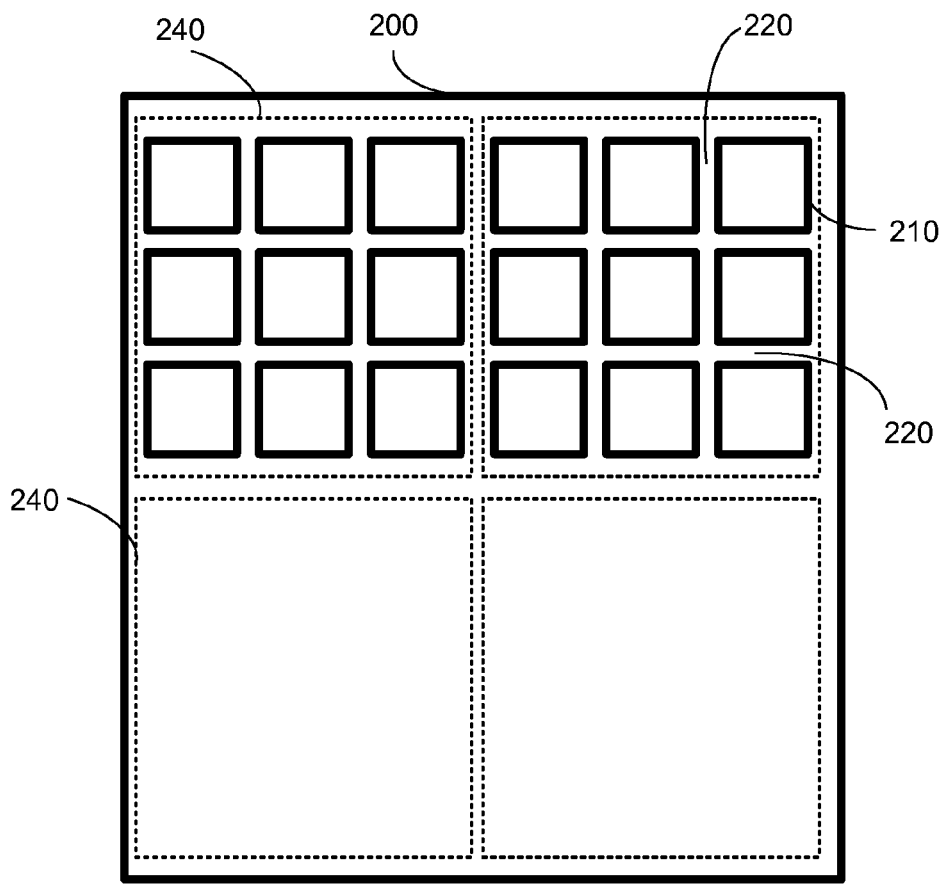
FIG. 2A presents a top-down view of part of a wafer on which regular-sized LEDs are separated by grooves in accordance with one embodiment of the present invention.

FIG. 2A presents a top-down view of part of a growth substrate 200 on which regular-sized LEDs are separated by grooves in accordance with one embodiment of the present invention. As illustrated in FIG. 2A, crisscross grooves 220 of a predetermined width are etched on growth substrate 200, thereby creating mesas on which LED structures are fabricated. After wafer bonding, the gaps which have been patterned on the initial growth substrate are retained between the LED structures, thereby forming arrays of regular-sized LEDs 210 whose light-emitting areas are separated from one another.

In one embodiment, multiple LED structures are coupled to form a high-power LED array. This array configuration is possible because the LED devices are separated from one another. A predetermined number (e.g. nine) of adjacent regular-sized LEDs 210 form a high-power LED array 240. Note that crisscross grooves 220 may be of the same or different depths and/or widths. Furthermore, grooves 220 are sufficiently wide to ensure that two LED structures on two separate mesas are not connected with each other. The actual depth and width required for the grooves may depend on the thickness of the LED multilayer structure.

In one embodiment, the crisscross grooves are of different widths (i.e., some are wide and others are narrow). The narrow grooves separate individual, regular-sized LEDs, while wider grooves separate high-power LED arrays. The size of each LED array, and correspondingly the pattern of the crisscross grooves, are determined by a predetermined requirement which specifies the power output of a single LED array.

Figure 2B:
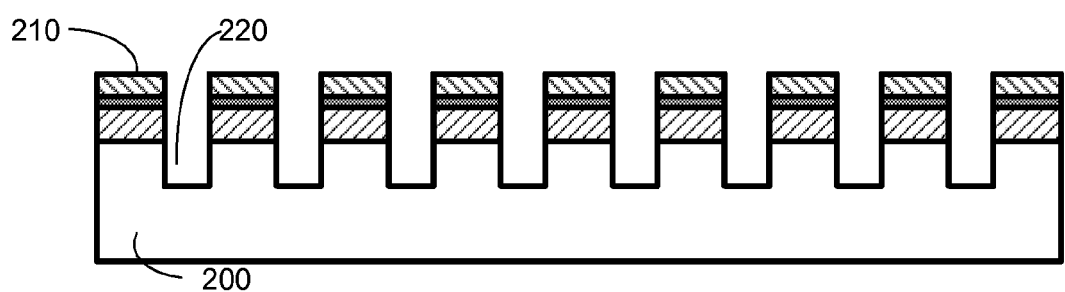
FIG. 2B presents a cross-section view of regular-sized LEDs separated by grooves of the same width in accordance with one embodiment of the present invention.
Figure 2C:
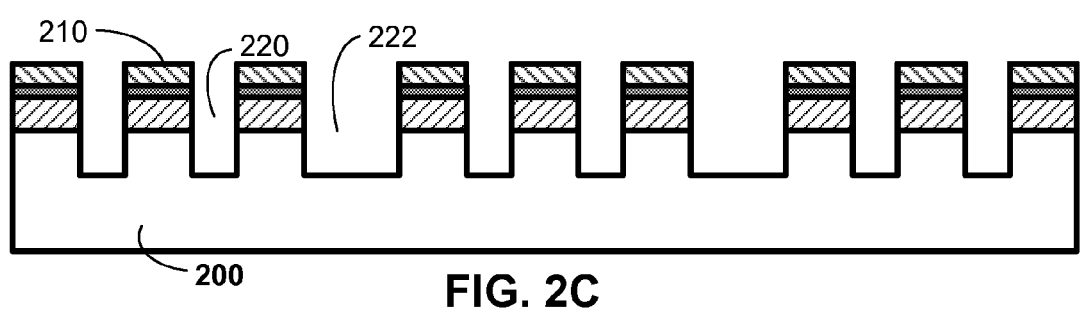
FIG. 2C presents a cross-section view of regular-sized LEDs separated by grooves of different widths in accordance with one embodiment of the present invention.

FIG. 2B presents a cross-section view of regular-sized LEDs separated by grooves of the same width in accordance with one embodiment of the present invention. Grooves 220 in FIG. 2B have the same width. In a further embodiment, as illustrated in FIG. 2C, the regular-sized LEDs can be separated by grooves of different widths. Grooves 220 in FIG. 2C are narrower than grooves 222. In one embodiment, wide grooves 222 demarcate LED arrays, while narrow grooves 220 separate individual LEDs within an array.

Figure 2D:
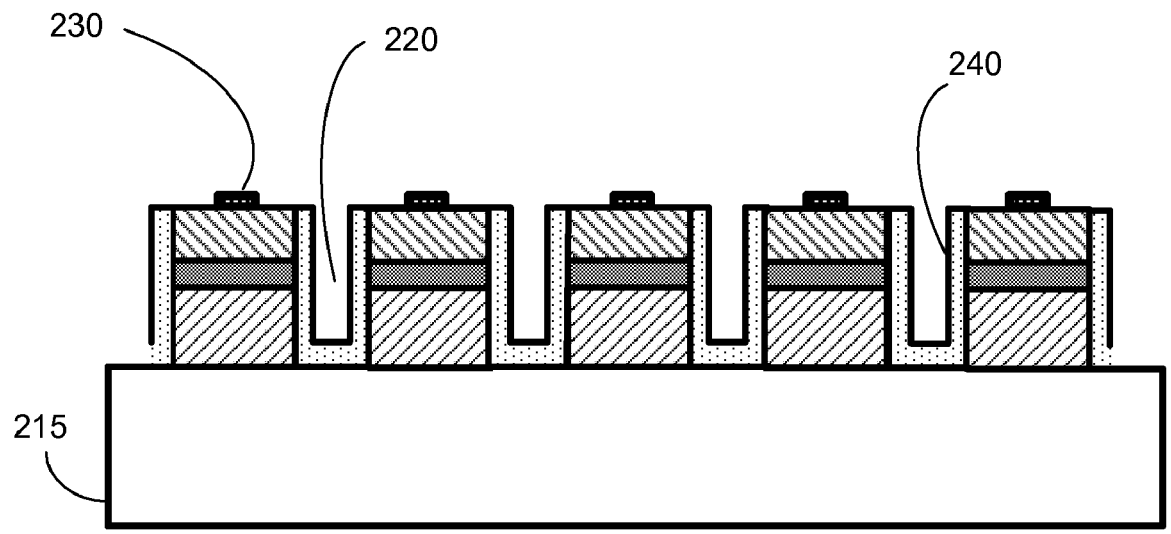
FIG. 2D presents a cross-section view of LEDs with an n-type electrode layer and a passivation layer in accordance with one embodiment of the present invention.

FIG. 2D presents a cross-section view of LEDs with an n-type electrode layer and a passivation layer in accordance with one embodiment of the present invention. Note that in this example, it is assumed that the n-type layer is fabricated on the growth substrate prior to the p-type layer, and, after wafer bonding and the multilayer structure is flipped over, the n-layer faces upward away from the conductive substrate which is bonded close to the p-type layer. Corresponding to operation 150, after the LED structures are wafer-bonded to a conductive substrate 215, a passivation layer 240 is deposited to cover the bottom and sidewalls of grooves 220. Next, n-type electrodes 230 are deposited on top of the LED structures. In one embodiment, the fabricated LED devices may first be patterned by photoresist, wherein the areas reserved for the electrodes are covered. Next, passivation layer 240, which may comprise $SiO_2$, is deposited. After release, the electrode areas are exposed, and the electrodes can be selectively deposited.

Figure 2E:
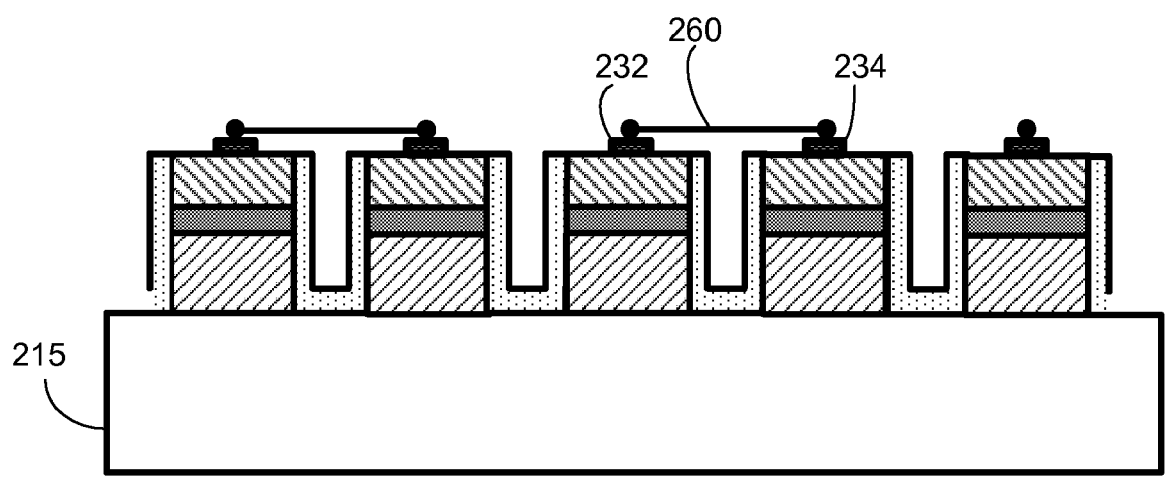
FIG. 2E presents a cross-section view of a high-power LED array based on regular-sized LEDs, wherein multiple LEDs are grouped together and share a common power supply, in accordance with one embodiment of the present invention.
Figure 2F:
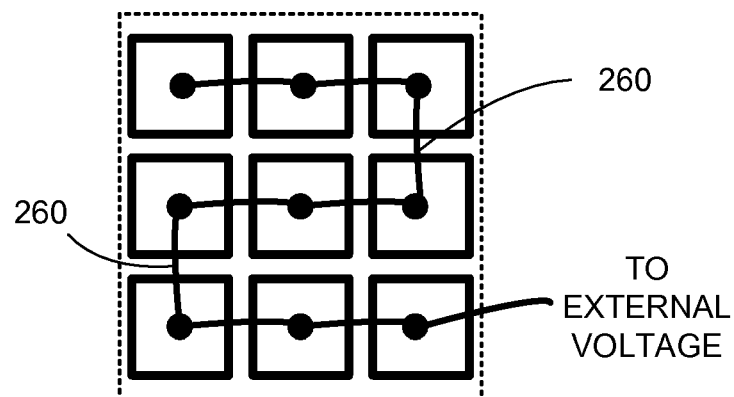
FIG. 2F presents a top-down view of a high-power LED array comprising nine regular-sized LEDs coupled with conductive wirings in accordance with one embodiment of the present invention.
Figure 2G:
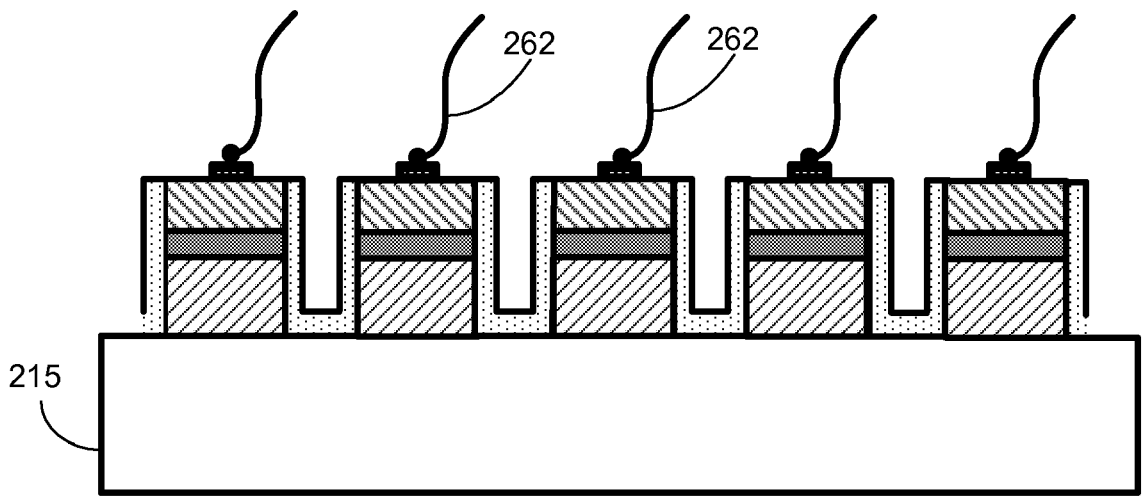
FIG. 2G presents a cross-section view of a high-power LED array which includes regular-sized LEDs with wires bonded to their respective ohmic contacts in accordance with one embodiment of the present invention.

FIGS. 2E-2G correspond to operation 160. FIG. 2E presents a cross-section view of a high-power LED array based on regular-sized LEDs, wherein multiple LEDs are grouped together and share a common power supply, in accordance with one embodiment of the present invention. In this example, a thin wire 260 is bonded to n-type electrodes 232 and 234 on two adjacent regular-sized LEDs. As a result, conductive paths can be created to couple a predetermined number (e.g., nine) of regular-sized LEDs together on the conductive substrate, so that all the individual LEDs in an array share a common power supply and become coupled in parallel. Note that it is assumed that for every LED, an ohmic contact is present between the p-type layer and conductive substrate 215, which serves as part of a common p-side electrode for all the LEDs in an array. Furthermore, instead of using wire bonding between two adjacent LEDs to create a conductive path, a metal conductive path coupling the electrodes of the two adjacent LEDs can be created at the same time as the electrodes, provided that passivation layer 240 can sufficiently isolate the sidewalls of the LED structures from the metal. FIG. 2F presents a top-down view of a high-power LED array comprising nine regular-sized LEDs coupled with conductive wirings in accordance with one embodiment of the present invention. Note that, during packaging, one or more of the LED electrodes may be coupled to an external voltage source. Furthermore, different wire patterns can be used to couple the LEDs within an array.

Figure 2H:
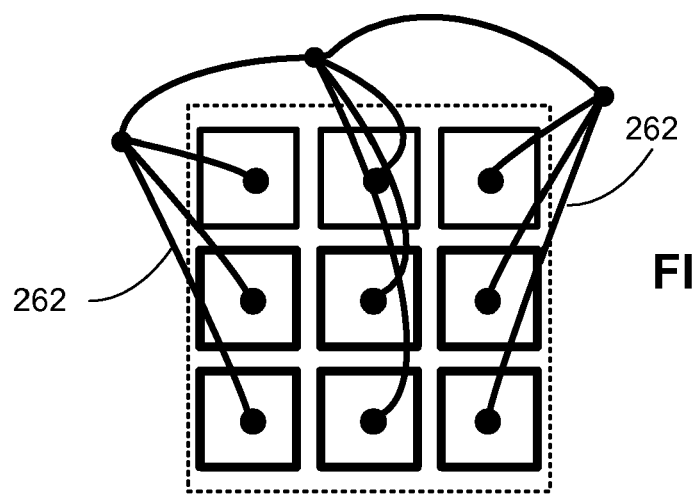
FIG. 2H presents a top-down view of a high-power LED array comprising nine regular-sized LEDs coupled by their respective n-type electrodes in accordance with one embodiment of the present invention.

FIG. 2G presents a cross-section view of a high-power LED array which includes regular-sized LEDs with wires bonded to their respective ohmic contacts in accordance with one embodiment of the present invention. In addition to the wiring pattern shown in FIG. 2F, coupling a plurality of regular-sized LEDs in parallel by wires 262 which are individually coupled to an external voltage source can also result in a parallel circuit and thus creates a high-power LED array. FIG. 2H presents a top-down view of a high-power LED array comprising nine regular-sized LEDs coupled by their respective n-type electrodes in accordance with one embodiment of the present invention.

In further embodiments, the electrodes of the individual LEDs within a single array can be coupled with one another during the deposition process. In other words, the wafer and LED devices can be patterned in such a way that, when the electrode material is deposited, a respective LED's electrode is coupled with another LED's electrode. This patterned deposition of electrode material can create conductive paths among the electrodes of all the LEDs within an array, and hence obviates the need for subsequent wire bonding between the LEDs.

Note that, the 3×3 array configuration illustrated in the examples above is only for illustration purposes. Other array configurations, such as 3×4, 4×4, 4×5, 5×5, etc., are also possible.

The following exemplary application further illustrates embodiments of the present invention. In one embodiment, regular-sized LEDs are fabricated using chemical vapor deposition. The fabrication process includes the following operations. First, a silicon growth substrate is patterned and etched with grooves. In one embodiment, the grooves are approximately 20 μm wide. As a result, mesas are formed on the growth substrate. Next, $In_xGa_yAl_{1-x-y}N$ multilayer structure is fabricated on the growth substrate, wherein each mesa supports a separate multilayer structure. A metal bonding layer, which in one embodiment is based on gold, is then deposited on the multilayer structures and on a separate conductive silicon substrate. Afterwards, the multilayer structures are flipped upside down and bonded with the conductive silicon substrate. In one embodiment, the bonding is performed using a 600 Kg force at or below 300° C. for a predetermined period. The bonded structure, which includes multiple individual LED devices "sandwiched" between the growth substrate and the conductive substrate, is subsequently placed in a solution comprising hydrofluoric acid, nitric acid, and acetic acid until the silicon growth substrate is removed. Note that the conductive substrate is protected from the wet etchant and thus remains bonded with the LED structures.

Note that after the removal of the original growth substrate, the grooves remain between and separate the LEDs, thereby creating arrays of LEDs whose light-emitting areas are separated from one another. In one embodiment, the grooves have two different widths. Between two neighboring wide grooves, there are two narrow ones. This pattern creates a high-power LED array which includes nine regular-sized LEDs.

Subsequently, an n-type electrode layer made of gold-germanium-nickel alloy and a passivation layer made of silicon dioxide are formed. Finally, a thin metal-based conductive path deposited on the passivation layer couples each pair of two adjacent regular-sized LEDs within one array. The wiring pattern is the same as shown in FIG. 2F, which shows nine LEDs coupled in parallel. One or more n-type electrodes are formed on top of the regular-sized LEDs, acting as the negative contact of the high-power LED array. The conductive substrate of the nine LEDs acts as the positive contact of the high-power LED array. The wafer is then diced along the wide grooves to separate the LED arrays. In a further embodiment, the LED structures can be directly fabricated on a conductive substrate which is patterned with grooves without the wafer-bonding process.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the appended claims.

What is claimed is:

1. A semiconductor light-emitting device, comprising:
   a number of LED devices supported by and coupled with a common conductive substrate, wherein each LED device includes an InGaAlN multilayer structure, and wherein the multilayer structure is bonded to the common conductive substrate via a metal bonding layer;
   wherein each LED device is separated from one another by one or more grooves;
   wherein each LED device comprises an electrode above its InGaAlN multilayer structure;
   wherein the grooves are covered by a passivation layer; and
   wherein at least one conductive path which couples the electrodes of two adjacent LED devices is created by depositing a layer of patterned metal on the passivation layer, thereby allowing the number of LED devices to share a common power supply and to emit light simultaneously to form a high-power LED array.

2. The device of claim 1, wherein the width of the grooves is greater than 15 μm and less than 25 μm.

3. The device of claim 1, wherein the width of the grooves is approximately 20 μm.

4. The device of claim 1, wherein the width of the grooves is approximately the same for all grooves.

5. The device of claim 1, wherein the widths of the grooves are different;
   wherein the wide grooves demarcate the LED arrays; and
   wherein the narrow grooves demarcate individual LEDs within an array.

6. The device of claim 1, wherein the electrode comprises gold-germanium-nickel alloy.

7. The device of claim 1, wherein the passivation layer comprises silicon dioxide.

* * * * *